United States Patent
Harris et al.

(10) Patent No.: US 8,664,664 B2
(45) Date of Patent: Mar. 4, 2014

(54) SILICON CARBIDE DIMPLED SUBSTRATE

(75) Inventors: Christopher Harris, Taby (SE); Cem Basceri, Reston, VA (US); Thomas Gehrke, Manassas Park, VA (US); Cengiz Balkas, Reston, VA (US)

(73) Assignee: Cree, Inc., Durham, NC (US)

( * ) Notice: Subject to any disclaimer, the term of this patent is extended or adjusted under 35 U.S.C. 154(b) by 1139 days.

(21) Appl. No.: 11/651,528

(22) Filed: Jan. 10, 2007

(65) Prior Publication Data

US 2007/0200116 A1 Aug. 30, 2007

Related U.S. Application Data

(60) Provisional application No. 60/757,481, filed on Jan. 10, 2006.

(51) Int. Cl.
*H01L 29/15* (2006.01)
*H01L 31/0312* (2006.01)

(52) U.S. Cl.
USPC .................................. 257/77; 257/E29.089

(58) Field of Classification Search
USPC ........................................... 257/77, E29.089
See application file for complete search history.

(56) References Cited

U.S. PATENT DOCUMENTS

| 5,597,744 | A * | 1/1997 | Kamiyama et al. ............ 438/285 |
|---|---|---|---|
| 6,649,497 | B2 | 11/2003 | Ring |
| 7,821,014 | B2 * | 10/2010 | Yonezawa et al. .............. 257/77 |
| 2001/0035580 | A1 * | 11/2001 | Kawai ........................... 257/745 |
| 2001/0040245 | A1 | 11/2001 | Kawai |
| 2002/0066960 | A1 * | 6/2002 | Ring .............................. 257/774 |
| 2003/0062526 | A1 | 4/2003 | Romano et al. |
| 2004/0046179 | A1 * | 3/2004 | Baur et al. ....................... 257/98 |
| 2004/0051136 | A1 | 3/2004 | Kataoka et al. |
| 2004/0082116 | A1 * | 4/2004 | Kub et al. ...................... 438/137 |
| 2004/0130002 | A1 * | 7/2004 | Weeks et al. .................. 257/622 |
| 2004/0241970 | A1 * | 12/2004 | Ring .............................. 438/571 |
| 2005/0118746 | A1 * | 6/2005 | Sumakeris et al. ........... 438/105 |
| 2005/0127397 | A1 | 6/2005 | Borges et al. |
| 2005/0233539 | A1 | 10/2005 | Takeuchi et al. |

(Continued)

FOREIGN PATENT DOCUMENTS

| JP | 2001267589 A | 9/2001 |
|---|---|---|
| JP | 2003168653 A | 6/2003 |

(Continued)

OTHER PUBLICATIONS

Examination Report for European patent application 0709682.4 mailed Jun. 28, 2012, 6 pages.

(Continued)

*Primary Examiner* — Matthew Landau
*Assistant Examiner* — Igwe U Anya
(74) *Attorney, Agent, or Firm* — Withrow & Terranova, P.L.L.C.

(57) ABSTRACT

A dimpled substrate and method of making including a substrate of high thermal conductivity having a first main surface and a second main surface opposite the first main surface. Active epitaxial layers are formed on the first main surface of the substrate. Dimples are formed as extending from the second main surface into the substrate toward the first main surface. An electrical contact of low resistance material is disposed on the second main surface and within the dimples. A back contact of low resistance and low loss is thus provided while maintaining the substrate as an effective heat sink.

30 Claims, 6 Drawing Sheets

(56) References Cited

U.S. PATENT DOCUMENTS

| | | |
|---|---|---|
| 2006/0091430 A1* | 5/2006 | Sriram et al. .................. 257/280 |
| 2006/0097268 A1* | 5/2006 | Kumar et al. ................... 257/77 |
| 2006/0118818 A1* | 6/2006 | Shimoida et al. ............. 257/183 |
| 2006/0170003 A1* | 8/2006 | Saito et al. .................... 257/189 |
| 2006/0183625 A1* | 8/2006 | Miyahara ..................... 501/98.4 |
| 2006/0226412 A1* | 10/2006 | Saxler et al. .................... 257/11 |
| 2006/0231841 A1* | 10/2006 | Okuno et al. .................... 257/66 |
| 2007/0114589 A1* | 5/2007 | Ueda et al. .................... 257/306 |
| 2008/0206989 A1* | 8/2008 | Kruger et al. ................. 438/667 |

FOREIGN PATENT DOCUMENTS

| | | |
|---|---|---|
| JP | 2003303966 A | 10/2003 |
| JP | 2004530289 A | 9/2004 |
| WO | 2004100277 A1 | 11/2004 |

OTHER PUBLICATIONS

Examination Report for European patent application 10182703.8 mailed Jun. 22, 2012, 5 pages.

Official Action issued Jan. 31, 2012, for Japanese Patent Application No. 2008-550366, 5 pages.

Summons to Attend Oral Proceedings for European Patent Application No. 10182703.8, mailed Jul. 19, 2013, 7 pages.

Summons to Attend Oral Proceedings for European Patent Application No. 07709682.4, mailed Jul. 19, 2013, 7 pages.

Decision to Grant for Japanese Patent Application No. 2008-550366, mailed Sep. 10, 2013, 2 pages.

* cited by examiner

US 8,664,664 B2

SILICON CARBIDE DIMPLED SUBSTRATE

CROSS REFERENCE TO RELATED APPLICATIONS

The present application claims the benefit of priority under 35 U.S.C. 119(e)(1) to U.S. Provisional Patent Application No. 60/757,481 entitled "SiC DIMPLED SUBSTRATE", filed Jan. 10, 2006, which is hereby incorporated by reference in its entirety for all purposes.

BACKGROUND OF THE INVENTION

1. Field of the Invention

This invention relates generally to microelectronic devices, and more particularly to silicon carbide power devices and LEDs.

2. Description of the Background Art

Silicon carbide has relatively high thermal conductivity, and thus has been used as a substrate for high power devices and LEDs. However, because of the low mobility of silicon carbide and the incomplete ionization of impurities in silicon carbide, silicon carbide substrates used as back contacts in vertical devices have high resistance. For example, the substrate of a silicon carbide 300V Schottky diode contributes about two-thirds of the overall on-resistance of the device. A conventional approach to reduce parasitic loss due to substrate resistance involves the removal or thinning of substrate material. However, in the case of silicon carbide substrates, this approach can be considered disadvantageous, because it entails removal of silicon carbide which is an effective heat sink. Thus, a technology is sought to provide a substrate that is an effective heat sink, but that has a low resistance back contact that does not contribute significant loss during device operation.

SUMMARY OF THE INVENTION

The present invention is therefore directed to a device and method which substantially overcomes one or more of the problems due to the limitations and disadvantages of the related art.

An object of the invention is to thus provide a semiconductor device including a silicon carbide substrate having a first main surface and a second main surface opposing the first main surface; an active epitaxial device layer on the first main surface of the silicon carbide substrate; a dimple extending from the second main surface into the silicon carbide substrate toward the first main surface; a first electrical contact on the active epitaxial device layer; and a second electrical contact overlying the second main surface and within the dimple.

A further object of the invention is to provide a method of forming a semiconductor device including epitaxially growing an active device layer on a first main surface of a silicon carbide substrate, the silicon carbide substrate having a second main surface opposing the first main surface; forming at least one dimple extending from the second main surface into the silicon carbide substrate toward the first main surface; forming a first electrical contact over the active device layer; and forming a second electrical contact overlying the second main surface and within the at least one dimple.

A still further object is to provide a substrate including a silicon carbide layer having a first main surface and a second main surface opposing the first main surface; an $Al_xGa_{1-x}N$ layer on the first main surface of the silicon carbide layer; an array of dimples extending from the second main surface into the silicon carbide substrate toward the first main surface; and a metallization layer overlying the second main surface of the silicon carbide layer and within the dimples.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE PREFERRED EMBODIMENT

Figure 1:
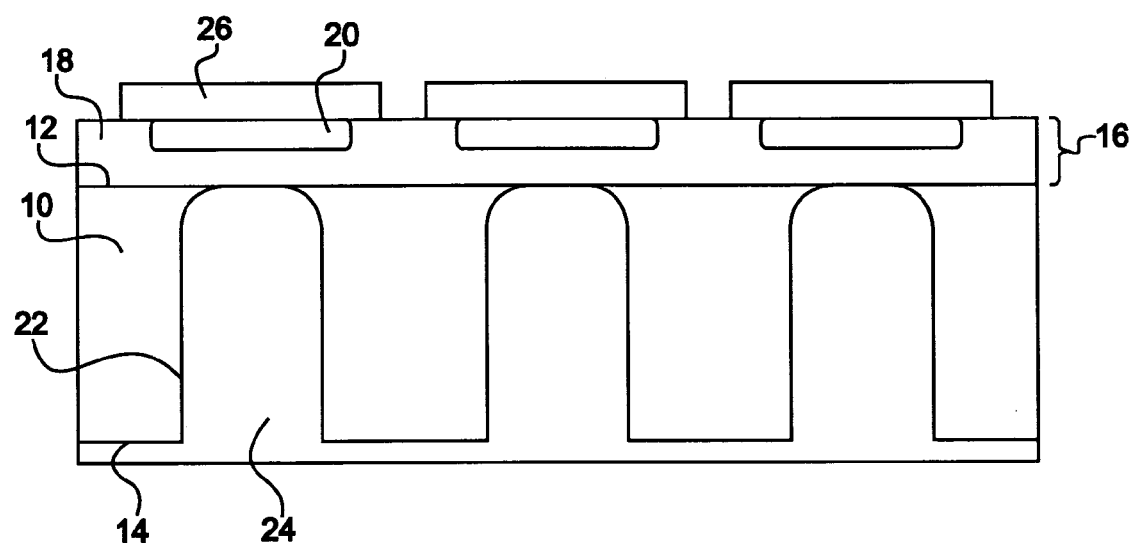
FIG. 1 illustrates a multiple contact device with dimpled substrate.

The invention will now be described more fully hereinafter with reference to the accompanying drawings, in which preferred embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

As shown in FIG. 1, substrate 10 includes first main surface 12 and second main surface 14 opposing first main surface 12. First and second main surfaces 12 and 14 may be respectively characterized as front and back sides of substrate 10, whereby devices are disposed on or over the first main surface 12 or front side of substrate 10. Substrate 10 is silicon carbide and has n-type conductivity, and may have a thickness of about 300 to 500 µm, or about 400 µm. Substrate 10 however should not necessarily be limited as silicon carbide, or as having n-type conductivity, but may be other materials such as silicon or sapphire.

As further shown in FIG. 1, active epitaxial layers 16 having an overall thickness of about 1 µm are disposed on first main surface 12 of substrate 10. Active device layers 16 include a first aluminum gallium nitride ($Al_xGa_{1-x}N$, hereinafter referred to as AlGaN) layer 18 on or over first main surface 12 and doped so as to have a first conductivity type, and second AlGaN layers 20 on or within AlGaN layer 18 and doped so as to have a second conductivity type opposite to the first conductivity type. AlGaN layer 18 and AlGaN layers 20 form respective p-n junctions. AlGaN layer 18 is doped n-type with silicon for instance, and AlGaN layer 20 is doped p-type with magnesium for instance. Active epitaxial layers 16 may however include silicon carbide or gallium nitride (hereinafter referred to as GaN) layers in addition to AlGaN layers, or combinations of these layers.

Substrate 10 as shown in FIG. 1 includes a plurality of dimples 22 formed therein, each of which extending from second main surface 14 through substrate 10 to active epitaxial layers 16, whereby a dimple 22 is disposed for each respective p-n junction formed by AlGaN layers 18 and 20. Each dimple 22 extends entirely through substrate 10 to active epitaxial layers 16. As will be subsequently described, dimples 22 may be disposed so as not to extend entirely through substrate 10. Of note, since dimpled substrate 10 allows direct contact to AlGaN layer 18, direct contact is realized without a heterojunction formed between silicon carbide and AlGaN layer 18. As a result, AlGaN layers 18 and 20 may in the alternative be respectively doped to have p-type conductivity and n-type conductivity.

Electrical contact 24 is disposed on second main surface 14 of substrate 10 and within dimples 22, to thus contact active epitaxial layers 16 exposed within dimples 22. Electrical contact 24 is shown as completely filling dimples 22. However, electrical contact 24 may alternatively be disposed conformally as a layer on second main surface 14 of substrate 10 and on the surfaces within dimples 22, and as having prescribed thickness such as 1 μm. Electrical contact 24 is a material having low electrical resistance as compared to substrate 10. Electrical contact 24 may be metallization such as titanium, aluminium, copper or tungsten; silicides such as $TiSi_x$ or $NiSi_x$; nitrides such as TiN or $WN_x$; combinations thereof; or polysilicon, amorphous silicon, or any other suitable contact material having low electrical resistance. Respective electrical contacts 26 are provided on or above AlGaN layers 20, and may be the same metallization as electrical contact 24, or any suitable contact material.

As should be understood in view of FIG. 1, access to active devices on the front side of first main surface 12 is provided from the back side or second main surface 14 of substrate 10, through dimples 22. Thus, direct electrical contact to devices made up of active epitaxial layers 16 is provided, while substantially eliminating serial resistance contributed by substrate 10 and while maintaining excellent overall thermal conductivity due to the use of silicon carbide as substrate material. This is provided without the necessity of thinning substrate 10 as conventionally done, thus reducing manufacturing expense and complexity while improving performance. As noted above, silicon carbide substrates when used as an electrical carrier contribute significantly to the overall on-resistance of a device. The use of dimpled substrates as in this embodiment should cut the contribution of substrate resistance. As an example, for a conventional vertical 300V Schottky diode, the substrate contributes about 60% of the overall on-resistance of the device, whereas a dimpled substrate of a 300V Schottky diode contributes about 30% of the overall on-resistance of the device. Similarly, for a vertical 600V Schottky diode the contribution of the substrate to the overall on-resistance of the device is reduced from about 30% to about 15% using dimpled substrate contacts, and for a vertical 1200V Schottky diode the contribution of the substrate to the overall on-resistance of the device is reduced from about 15% to about 7.5% using dimpled substrate contacts.

In FIG. 1, active epitaxial layers 16 are described as including p-n junctions consisting of first and second AlGaN layers 18 and 20 that are doped so as to have different respective conductivity type. Accordingly, each of the active regions may be power devices such as diodes, Schottky diodes or light emitting diodes (LEDs). However, the devices made up of active epitaxial layers 16 in FIG. 1 should not be limited merely to AlGaN layered p-n junction devices. For example, active epitaxial layers 16 may be epitaxially grown silicon carbide layers having different respective conductivity type. Moreover, the devices made up of active epitaxial layers 16 may also include MOSFETs, BJTs, n-channel IGBTs, thyristors and/or vertical JFETs, or other various devices. Electrical contact is provided to the devices from the back side or second main surface of a substrate such as silicon carbide in a vertical manner through dimples, so that devices with excellent thermal conductivity and low resistance contact are realized.

Figure 2:
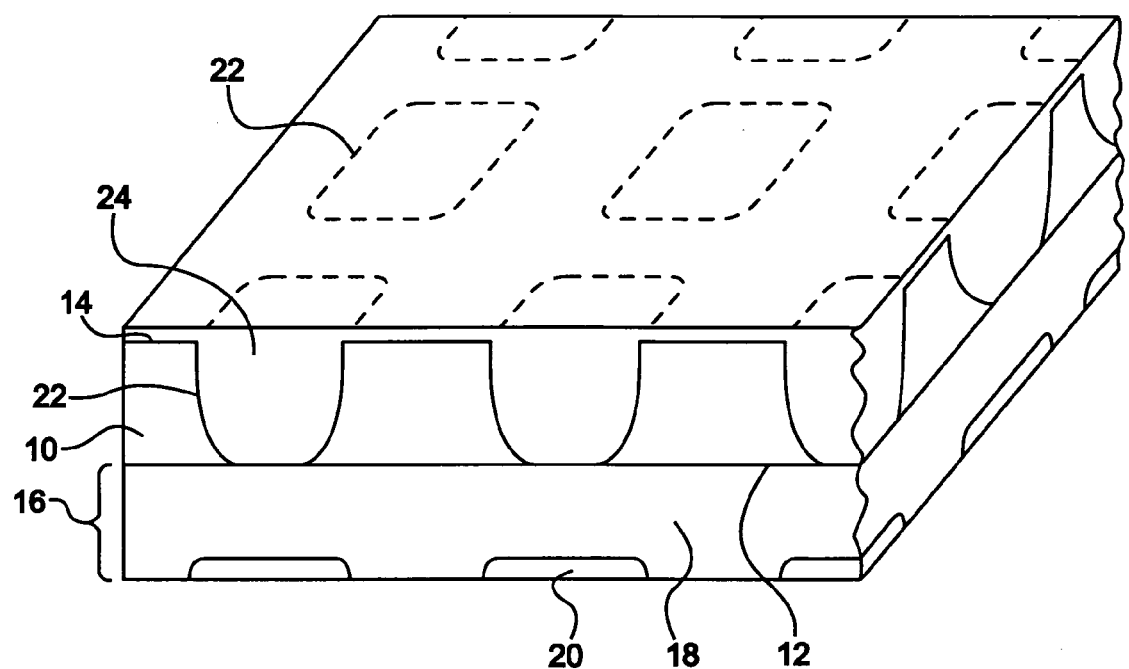
FIG. 2 illustrates a partial perspective view of the back side of the device of FIG. 1, with arrayed dimples.

Moreover, although FIG. 1 shows three separate p-n junctions within active epitaxial layers 16 and three corresponding dimples 22, the number and disposition of dimples 22 within substrate 10 should not be necessarily limited as shown. A single dimple, or any number of dimples may be formed in substrate 10. For example, FIG. 2 shows a partial perspective view of the back side of substrate 10 including a two-dimensional regular array of dimples 22, which are in part depicted by dashed ghost lines. Dimples 22 are shown as extending from second main surface 14, through substrate 10 to first main surface 12, to be in contact with active epitaxial layers 16 which include first and second AlGaN layers 18 and 20 consistent with FIG. 1. Dimples 22 as depicted by the ghost lines are shown as oval in shape, and may have a diameter of between about 10 μm and 1 mm. In the alternative, dimples 22 may be circular in shape. Moreover, dimples 22 of the regular array may be disposed along directions parallel to a specific crystallographic direction (such as 11-20 or 1-100 directions) of substrate 10, to aid in stress relief and help prevent breakage of substrate 10. Alternatively, dimples 22 may be disposed randomly within an array.

Figure 3:
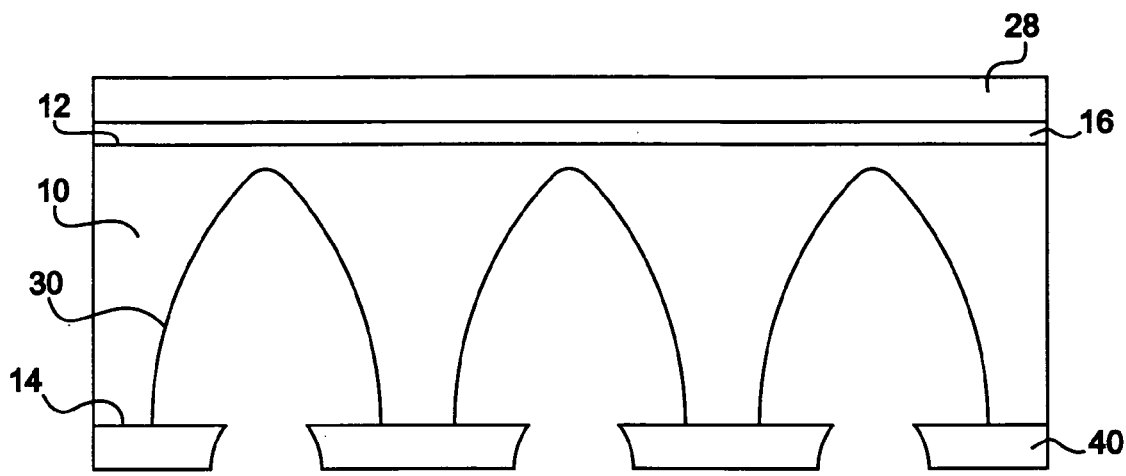
FIG. 3 illustrates a dimpled substrate as formed by chemical etching.

Dimple formation and different respective dimple profiles are next described with reference to FIGS. 3-6. In FIG. 3, dimples 30 are shown as extending from second main surface 14 through substrate 10 toward first main surface 12. Active epitaxial layers 16 are shown as a single layer, but should be understood as including multiple layers of various different epitaxial layers that can make up various different devices as described with respect to FIG. 1, but which are omitted in FIG. 3 (and also in FIGS. 4-6) for the sake of simplicity. Contact layer 28 is shown on or above active epitaxial layers 16, and in a subsequent step may be patterned if necessary to form respective electrical contacts such as contacts 26 shown in FIG. 1. Also, a silicon dioxide mask 40 is shown as disposed on second main surface 14 of substrate 10.

In FIG. 3, chemical etching is carried out using silicon dioxide mask 40 to form dimples 30. As noted, substrate 10 is silicon carbide. A high temperature $Cl_2/O_2$ gas mixture is used as an etchant to form dimples 30 under the following conditions for example: 800° C., 10% $Cl_2$ in oxygen. Substrate 10 is thus etched substantially isotropically, whereby dimples 30 are formed as having a somewhat broad shape with gradual sloped sidewalls. An advantage of chemical etching as described with respect to FIG. 3 is that dimples having such broad shape with gradually sloped sidewalls are easy to metallize.

It should be understood that although the etching of silicon carbide using purely chemical means may be difficult, the chemical composition of the etchants used to etch silicon carbide substrate 10 in connection with the embodiment described with respect to FIG. 3 may be varied. For example, Ar or He or other reactive gases such as group VII elements F or Br may be added to the etchant gas. Also, since substrate 10 should not necessarily be limited as silicon carbide, and since various other substrate materials may be used, it should likewise be understood that a variety of chemical etchants suitable for specific various materials may be utilized. Also, although mask 40 is described as being silicon dioxide, other mask materials such as other oxide or nitride dielectrics ($Al_2O_3$, $SiN_x$) may be used as appropriate.

Figure 4:
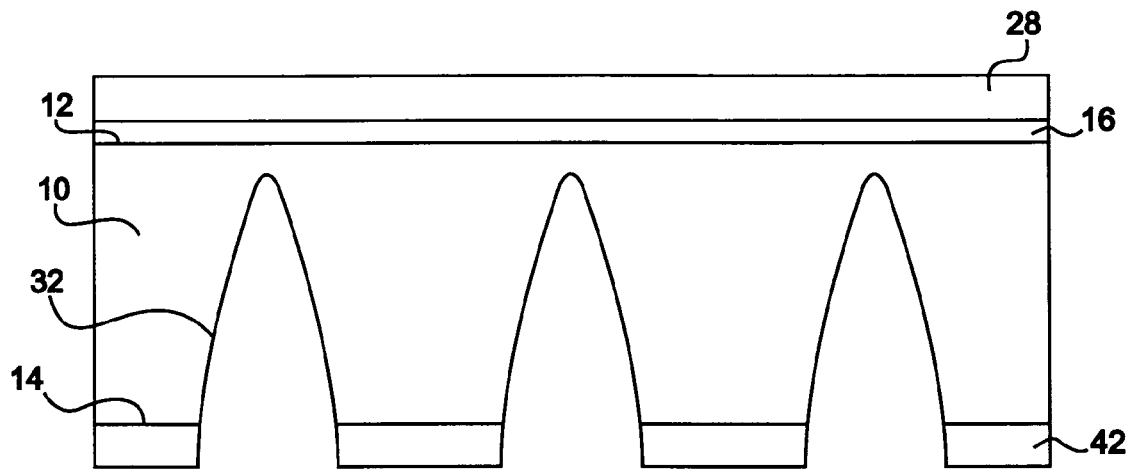
FIG. 4 illustrates a dimpled substrate as formed by dry plasma etching.

In FIG. 4, dimples 32 are shown as extending from second main surface 14 through substrate 10 toward first main surface 12. Active epitaxial layers 16 are shown as a single layer, but should be understood as including multiple layers of various different epitaxial layers that can make up various different devices as described with respect to FIG. 1. Contact layer 28 is on or above active epitaxial layers 16, and in a subsequent step may be patterned if necessary to form respective electrical contacts such as contacts 26 shown in FIG. 1. Also, metal mask 42 is disposed on second main surface 14 of substrate 10.

In FIG. 4, plasma etching using for example high density plasmas (such as ICP) is carried out using metal mask 42, to form dimples 32. Substrate 10 is silicon carbide, and the plasma etching may be carried out using Fl based gases $SF_6$, $CHF_3$ or $CF_4$, for example. Substrate 10 is thus etched predominantly anisotropically, and is thus shown as having a profile that is somewhat narrower than as shown in FIG. 3 and which has steeper sidewalls.

It should be understood that various other suitable plasma etching conditions may be used to etch silicon carbide substrate 10 in connection with FIG. 4. Since substrate 10 should not necessarily be limited to silicon carbide, and since other various substrate materials may be used, it should likewise be understood that a variety of plasma etchant systems suitable for specific various materials may be utilized.

Figure 5:
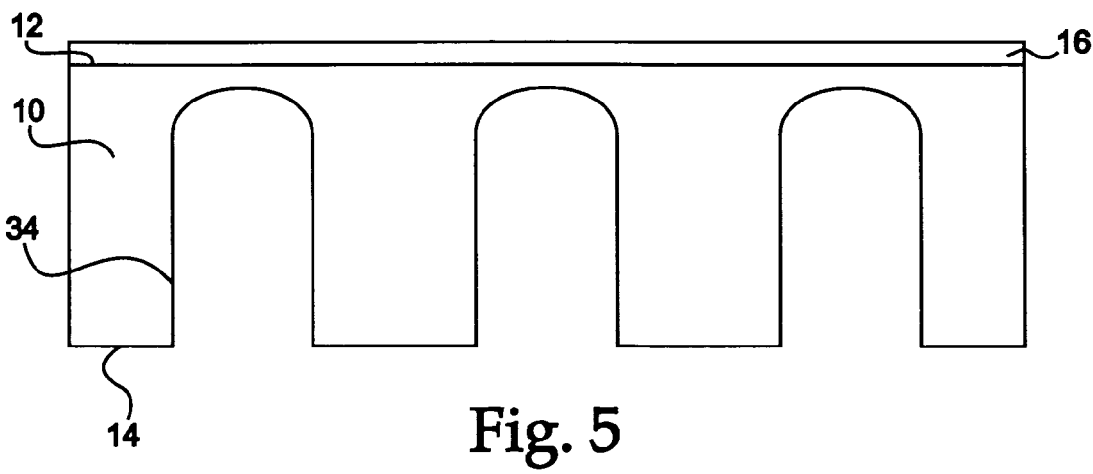
FIG. 5 illustrates a dimpled substrate as formed by laser ablation.

In FIG. 5, laser ablation is carried out to form dimples 34, without utilizing a mask. A YAG laser for example, which is commonly used for wafer marking to burn an identity number, may be tuned to ablate substrate 10 to form dimples 34. A variety of ablation parameters such as absorption of laser light and heat conductivity of the material to be ablated must be taken into consideration. In greater detail, it is known that silicon carbide is an extremely inert material that conducts heat very well. For example, selection of a wavelength with minimum absorption depth will help to ensure high energy deposition in a small volume for rapid and complete ablation. Selection of a short pulse duration will help to maximize peak power, and minimize thermal conduction to the substrate or work material surrounding the targeted ablation zone. Selection of pulse repetition rate is also important. A more rapid pulse repetition rate will help to retain residual heat in the ablation zone, limiting the time for conduction and thus increasing efficiency of laser ablation. In other words, more of the incident energy will contribute to ablation and less will be lost to the substrate, work material or environment. Beam quality is also an important factor, and may be controlled in terms of brightness (energy), focusability, and homogeneity. The beam should be of controlled size, so that the ablation zone is not larger than desired, to thus prevent formation of dimples with excessively sloped sidewalls.

In FIG. 5 substrate 10 is silicon carbide. In this case, a KrF excimer laser (wavelength 248 nm) for example may be used for laser ablation under the following conditions: typical pulse width in the range of 10-100 ns and a repetition rate of 1-50 Hz, whereby the laser beam is focused to give an energy density in the range of 5-50 $cm^{-2}$. However, it should be understood that various other laser types and/or parameters as appropriate may be used. Dimples 34 as shown in FIG. 5 are thus provided as having highly controlled shape and sidewall slope. Moreover, processing is simplified, faster and more efficient, whereby mask formation, mask patterning and mask removal steps are eliminated.

As previously described, the dimples in general may be circular or oval in shape. However, the shape of the dimples is not limited. For example, dimples as formed by laser ablation in connection with FIG. 5 would be circular or oval shaped, as defined by beam profile. However, the dimples may also be square, rectangular, or triangular shaped, or any other shape as desired, as defined by masks 40 and 42 used in connection with FIGS. 3 and 4 respectively. The dimples may also be irregularly shaped of various length and/or width. As previously described, dimple diameter may be in the range of about 10 µm and 1 mm. Typically, the dimples have a depth from first main surface 14 as shown in FIG. 1 that is at least about half the thickness of substrate 10, for example. However, it should be understood that dimple depth may be selected as desired, and may be less than about half the thickness of the corresponding substrate if desired.

Figure 6:
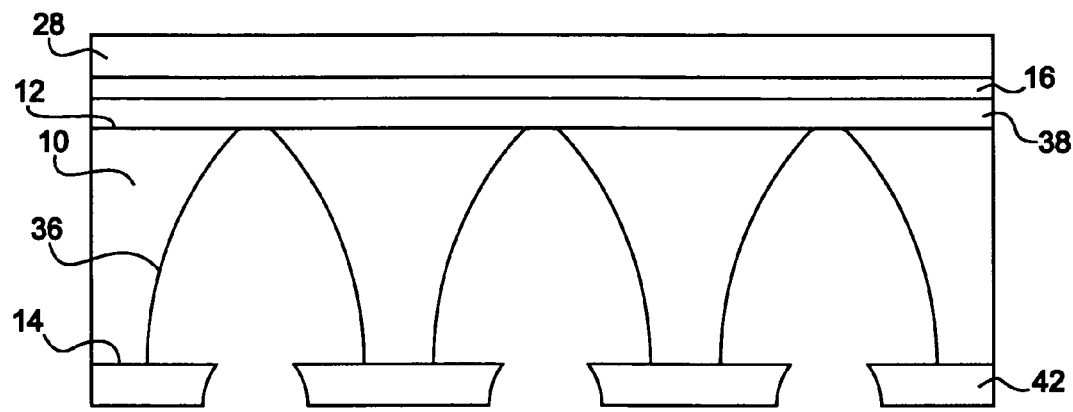
FIG. 6 illustrates a dimpled substrate as formed by chemical etching and using an etch stop layer.

In a variation of the process described with respect to FIG. 4, plasma based chemical etching is carried out in FIG. 6 using mask 42 and etch stop layer 38. For substrate 10 made of silicon carbide, etch stop layer 38 as disposed on first main substrate 10 may be gallium nitride. In FIG. 6, dimples 36 are shown as extending from second main surface 14 through substrate 10 toward first main surface 12. Active epitaxial layers 16 are shown as a single layer disposed on etch stop layer 38, but should be understood as including multiple layers of various different materials that make up various different devices as described with respect to FIG. 1. Contact layer 28 is shown on or above active epitaxial layers 16, and in a subsequent step may be patterned if necessary to form respective electrical contacts such as contacts 26 shown in FIG. 1. Also, a metal mask 42 is shown as disposed on second main surface 14 of substrate 10.

In FIG. 6, plasma based chemical etching is carried out using mask 42 and etch stop layer 38, so that dimples 36 extend all the way to etch stop layer 38. As noted above, substrate 10 and etch stop layer 38 are respectively silicon carbide and gallium nitride. A fluorine based etch chemistry such as $SF_6$, $CF_4$ or $CHF_3$ having high etch selectively with respect to silicon carbide and gallium nitride may be used, so that silicon carbide substrate 10 is etched at a significantly higher rate than etch stop layer 38. Use of etch stop layer 38 as described simplifies dimple formation and improves accuracy and efficiency. It should also be understood that the use of silicon carbide, gallium nitride and the above noted etchants should not be considered as limiting. Various substrate materials, etchants and corresponding suitable etch stop layers may be respectively utilized.

Figure 7:
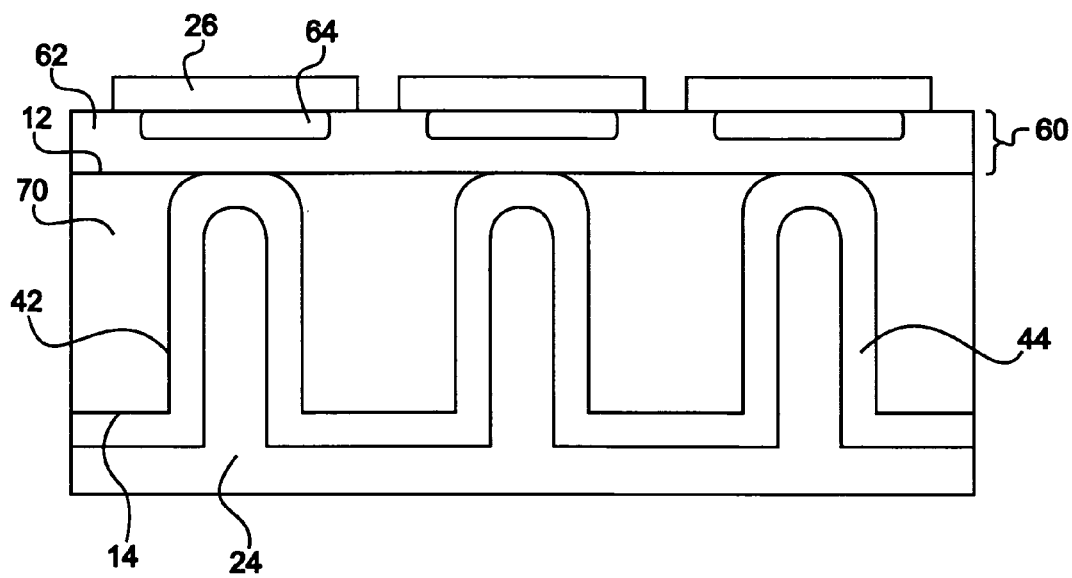
FIG. 7 illustrates a multiple contact device with additional epitaxy overgrowth within the dimples.

FIG. 7 illustrates a variation of the structure described with respect to FIG. 1, wherein FIG. 7 includes dimples 42 overgrown with additional silicon carbide epitaxy. In FIG. 7, active epitaxial layers 60 are shown as grown on first main surface 12 of substrate 70, whereby substrate 70 is n-type silicon carbide and has a thickness of about 300 to 500 µm, or about 400 µm. Active epitaxial layers 60 have an overall thickness of at least about 50 µm, or about 100 µm. Active epitaxial layers 60 include first SiC layer 62 doped to have n-type conductivity and epitaxially grown on first main surface 12 of SiC substrate 70, and second SiC layers 64 doped to have p-type conductivity and grown on or in first SiC layer 62. Initially, dimples 42 are formed first by chemical etching, dry plasma etching or laser ablation as described previously, to extend entirely through substrate 70. Respective electrical contacts 26 are provided on or above active epitaxial layers 60, and may be metallization such as nickel, titanium or tungsten.

Prior to formation of electrical contact 24 shown in FIG. 7, dimples 42 and second main surface 14 of silicon carbide substrate 70 are overgrown with an additional silicon carbide epitaxial layer 44. Silicon carbide epitaxial layer 44 may be formed by Metal Organic Chemical Vapor Deposition (MOCVD) using standard process conditions. Silicon carbide epitaxial layer 44 may have a thickness of about 1 µm. In this structure, additional p-type silicon carbide epitaxial layer 44 has been added so that substrate 10 may in effect have the function of a p-type substrate.

Figure 8A:
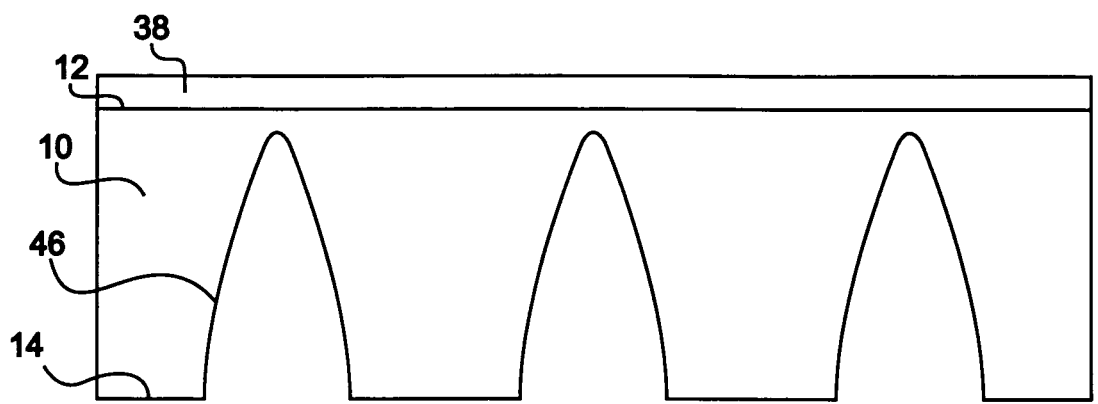
FIGS. 8A-8C illustrate a two-stage process of dimple formation.

A two-stage process of dimple formation is next described in connection with FIGS. 8A-8C. As shown in FIG. 8A, substrate 10 includes first main surface 12 having etch stop layer 38 thereon. Active epitaxial layers and electrical contacts (not shown for simplicity) are formed over etch stop layer 38. As previously described, substrate 10 is silicon carbide and etch stop layer 38 is gallium nitride, although other suitable substrate and etch stop materials may be used. Dimples 46 extend from second main surface 14 through substrate 10 toward first main surface 12, and may be formed in a first stage by chemical etching or laser ablation as previously described. However, the shape of dimples 46 in FIGS. 8A-8C should be considered as general, and the shape does not imply that the dimples are formed specifically by chemical etching or laser ablation. In the case wherein dimple formation is by chemical etching, FIG. 8A is shown after mask removal. Dimple formation in FIG. 8A is controlled so that dimples 46 do not extend entirely through substrate 10, such control being well within the level of ordinary skill. For example, for a substrate 10 having thickness of about 350 µm, dimples 46 may have a depth of about 300 µm.

Figure 8B:
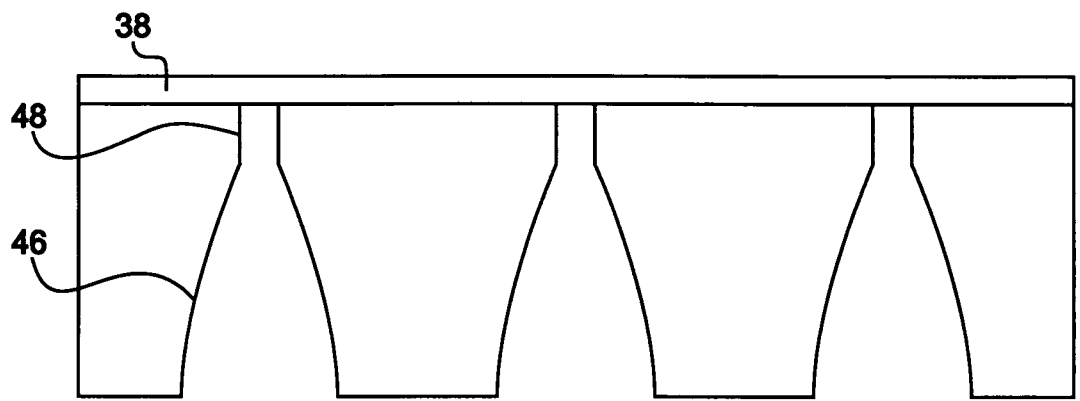
Figure 8C:
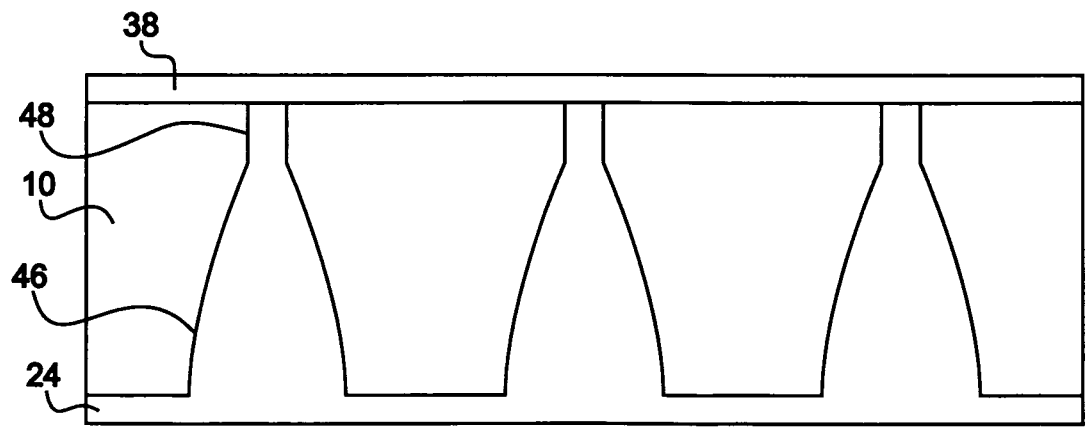

As shown in FIG. 8B, a subsequent selective dry etching is carried out using etch stop layer 38, to thereby form vias 48 through the remaining portion of substrate 10 between dimples 46 and first main surface 12. This subsequent dry etching may be carried out using conditions similar to those previously described for the formation of dimples. In this case, a mask is not necessary because etching of the surrounding non-dimpled substrate will not adversely effect the performance of the substrate. Thereafter, electrical contact 24 is formed on second main surface 14 and within vias 48 and dimples 46 as shown in FIG. 8C. As a result of dimple formation in this two step process, a more controlled etch rate can be implemented in the second step, increasing the selectivity of the etching process. Also, the slope of the sidewalls may be controlled by this two step process, to aid in metallization of the dimples.

Figure 9:
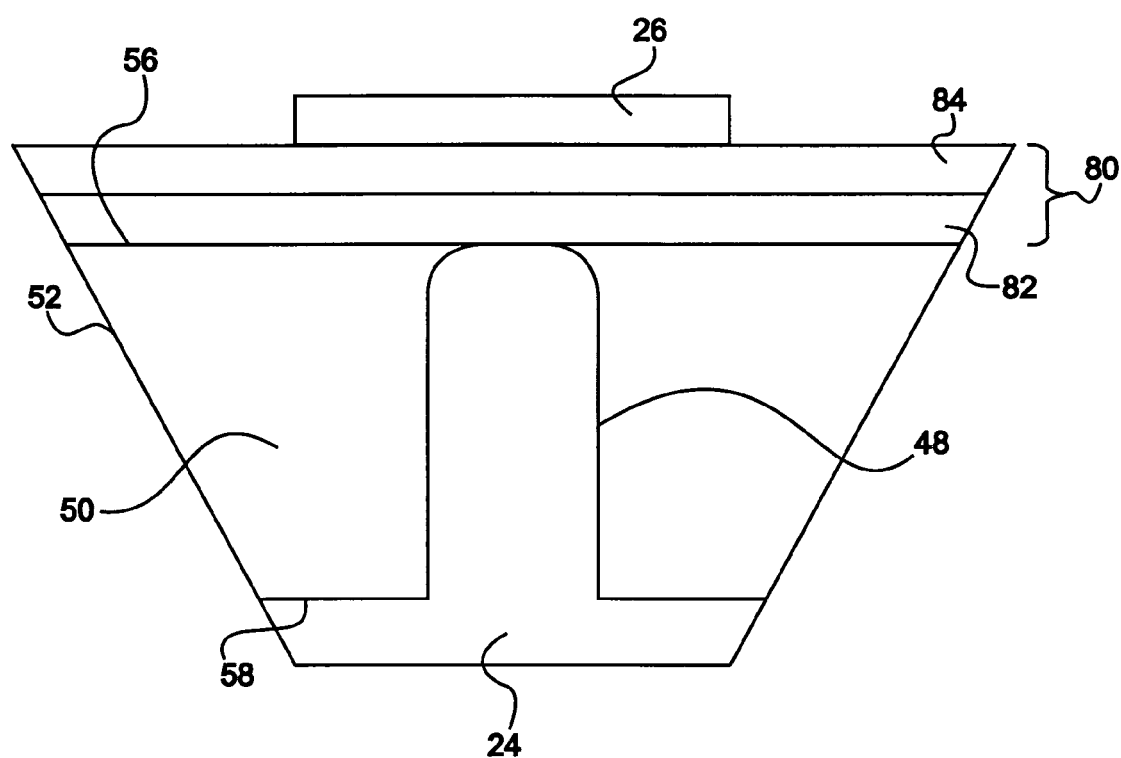
FIG. 9 illustrates an LED chip construction with transparent substrate.

FIG. 9 illustrates an LED chip constructed as including a dimpled substrate. As shown in FIG. 9, the LED chip includes substrate 50 having first main surface 56, and second main surface 58 opposing first main surface 56. First and second main surfaces 56 and 58 may be respectively characterized as front and back sides of substrate 50. Substrate 50 in this case is transparent silicon carbide and may have a thickness of about 300-500 microns, or about 400 microns, but may have other various thicknesses.

Active epitaxial layers 80 are disposed on first main surface 56 of transparent substrate 50, as further shown in FIG. 9. Active epitaxial layers 80 include GaN layer 82 doped so as to have a first conductivity type and epitaxially grown on first main surface 56, and AlGaN layer 84 doped so as to have a second conductivity type opposite the first conductivity type and epitaxially grown on GaN layer 82. GaN layer 82 has n-type conductivity and AlGaN layer 84 has p-type conductivity, although layers 82 and 84 may in the alternative be doped to respectively have p-type and n-type conductivities.

Dimple 48 is formed within transparent substrate 50 as shown in FIG. 9, extending from second main surface 58 through to first main surface 56. Dimple 48 may be formed by chemical etching, dry plasma etching, laser ablation or a combination thereof as previously described. Dimple 48 extends entirely through transparent substrate 50, but in the alternative may extend partly therethrough so that a portion of transparent substrate 50 remains between dimple 48 and active epitaxial layers 80. Electrical contact 24 is formed on second main surface 58 and within dimple 48. In the alternative, electrical contact 24 may be disposed conformally as a layer on second main surface 58 and within dimple 48, so as not to entirely bury or fill dimple 48. Electrical contact 24 may be materials such as described previously. The LED chip as shown in FIG. 9 may be initially formed on a wafer including a plurality of like formed LEDs, whereby the wafer is then cut to form single LED chips as shown in FIG. 9. Sidewalls 52 of transparent substrate 50 are shown as cut to be gradually sloped, so that internal reflection of generated light helps to increase efficiency of the LED. It should however be understood that sidewalls 52 may also be cut to be substantially vertical.

The invention being thus described, it will be obvious that the same may be varied in many ways. Such variations are not be to regarded as a departure from the spirit and scope of the invention, and all such modifications as would be obvious to one skilled in the art are intended to be included within the scope of the following claims.

What is claimed is:

1. A semiconductor device comprising:
   a silicon carbide substrate having a first main surface and second main surface opposing the first main surface;
   an active epitaxial device layer on the first main surface of the silicon carbide substrate;
   a dimple extending from the second main surface into the silicon carbide substrate toward the first main surface;
   a first electrical contact over the active epitaxial device layer;
   a second electrical contact overlying the second main surface and within the dimple; and
   a doped epitaxial silicon carbide layer on the second main surface of the silicon carbide substrate and within the dimple, the doped epitaxial silicon carbide layer having a conductivity type opposite a conductivity type of the silicon carbide substrate.

2. The semiconductor device of claim 1, wherein the active epitaxial device layer is silicon carbide.

3. The semiconductor device of claim 1, wherein the active epitaxial device layer comprises a gallium nitride layer and an aluminum gallium nitride layer.

4. The semiconductor device of claim 1,
   wherein the second electrical contact is disposed on the doped epitaxial silicon carbide layer.

5. The semiconductor device of claim 1, further comprising additional dimples extending from the second main surface into the silicon carbide substrate, wherein the dimple and the additional dimples are disposed in an array.

6. The semiconductor device of claim 5, wherein the dimple and the additional dimples are disposed randomly in the array.

7. The semiconductor device of claim 5, wherein the dimple and the additional dimples are disposed regularly in the array along directions parallel to a crystallographic direction of the silicon carbide substrate.

8. The semiconductor device of claim 1, wherein the active epitaxial device layer comprises:
   a first $Al_xGa_{1-x}N$ layer on the first main surface of the silicon carbide substrate; and
   a second $Al_xGa_{1-x}N$ layer on the first $Al_xGa_{1-x}N$ layer, wherein the first and second $Al_xGa_{1-x}N$ layers have different respective conductivity types and constitute a light emitting diode.

9. The semiconductor device of claim 8, wherein the first $Al_xGa_{1-x}N$ layer has n-type conductivity.

10. The semiconductor device of claim 1, wherein the second electrical contact is metal.

11. The semiconductor device of claim 1, wherein the second electrical contact is a metal silicide.

12. The semiconductor device of claim 1, wherein the second electrical contact is a metal nitride.

13. The semiconductor device of claim 1, wherein a diameter of the dimple is between about 100 82 m and 1 mm.

14. The semiconductor device of claim 1, wherein the silicon carbide substrate is transparent.

15. The semiconductor device of claim 1, wherein the dimple has a depth of at least about half a thickness of the silicon carbide substrate.

16. A substrate comprising:
a silicon carbide layer having a first main surface and a second main surface opposing the first main surface;
an $Al_xGa_{1-x}N$ layer on the first main surface of the silicon carbide layer;
an array of dimples extending from the second main surface into the silicon carbide layer toward the first main surface; and
a metallization layer overlying the second main surface of the silicon carbide layer and within the dimples; and
a doped epitaxial silicon carbide layer on the second main surface of the silicon carbide layer and within at least one dimple of the array of dimples, the doped epitaxial silicon carbide layer having a conductivity type opposite a conductivity type of the silicon carbide layer.

17. The substrate of claim 16, further comprising a second metallization layer on the $Al_xGa_{1-x}N$ layer.

18. The substrate of claim 16, wherein the $Al_xGa_{1-x}N$ layer comprises:
a first $Al_xGa_{1-x}N$ sub-layer on the silicon carbide layer; and
a second $Al_xGa_{1-x}N$ sub-layer on the first $Al_xGa_{1-x}N$ sub-layer,
wherein the first and second $Al_xGa_{1-x}N$ sub-layers have different respective conductivity type.

19. The substrate of claim 18, wherein the first $Al_xGa_{1-x}N$ sub-layer has n-type conductivity.

20. The substrate of claim 16, wherein the dimples have a depth of at least about half a thickness of the silicon carbide layer.

21. A substrate comprising:
a first layer having a first main surface and a second main surface opposing the first main surface;
an active layer on the first main surface of the first layer;
an array of dimples extending from the second main surface into the first layer toward the first main surface;
a metallization layer overlying the second main surface of the first layer and within the dimples; and
a doped epitaxial layer on the second main surface and within at least one dimple of the array of dimples, the doped epitaxial layer having a conductivity type opposite a conductivity type of the substrate.

22. The substrate of claim 21, further comprising a second metallization layer on the active layer.

23. The substrate of claim 21, wherein the active layer comprises:
a first $Al_xGa_{1-x}N$ sub-layer on the first layer; and
a second $Al_xGa_{1-x}N$ sub-layer on the first $Al_xGa_{1-x}N$ sub-layer,
wherein the first and second $Al_xGa_{1-x}N$ sub-layers have different respective conductivity types.

24. The substrate of claim 23, wherein the first $Al_xGa_{1-x}N$ sub-layer has n-type conductivity.

25. The substrate of claim 21, wherein the first layer is silicon carbide.

26. The substrate of claim 21, wherein the dimples have a depth of at least about half a thickness of the first layer.

27. A substrate comprising:
a first layer having a first main surface and a second main surface;
an active layer having a third main surface and a fourth main surface, the active layer on the first layer with the third main surface facing the first main surface;
an array of dimples through the first layer that expose the third main surface;
a doped epitaxial layer on the second main surface of the first layer and within the dimples, the doped epitaxial layer having a conductivity type opposite a conductivity type of the first layer; and
a metallization layer disposed on the doped epitaxial layer such that the metallization layer is overlying the second main surface of the first layer and within the dimples, and in contact with the third main surface of the active layer.

28. The substrate of claim 27, wherein the first layer and the active layer are silicon carbide.

29. The substrate of claim 27, wherein the first layer is silicon carbide, and the active layer comprises a gallium nitride layer and an aluminum gallium nitride layer.

30. The substrate of claim 27, wherein the active layer comprises:
a first $Al_xGa_{1-x}N$ layer on the first main surface of the first layer; and
a second $Al_xGa_{1-x}N$ layer on the first $Al_xGa_{1-x}N$ layer,
wherein the first and second $Al_xGa_{1-x}N$ layers have different respective conductivity type and constitute a light emitting diode.

* * * * *